United States Patent [19]

Nakada

[11] Patent Number: 5,492,569
[45] Date of Patent: Feb. 20, 1996

[54] METHOD OF AUTOMATICALLY CLEANING A VACUUM VAPOR DEPOSITION TANK

[75] Inventor: Junji Nakada, Kanagawa, Japan

[73] Assignee: Fuji Photo Film Co., Ltd., Kanagawa, Japan

[21] Appl. No.: 213,593

[22] Filed: Mar. 16, 1994

[30] Foreign Application Priority Data

Mar. 17, 1993 [JP] Japan ..................... 5-081199

[51] Int. Cl.⁶ ........................................... B08B 7/04
[52] U.S. Cl. .................. 134/18; 134/32; 134/42
[58] Field of Search ............. 134/10, 18, 22.18, 134/23, 24, 30, 32, 42, 36, 37, 59, 61, 72, 82

[56] References Cited

U.S. PATENT DOCUMENTS

| | | | |
|---|---|---|---|
| 3,079,286 | 2/1963 | Kearney et al. | 134/30 X |
| 3,985,572 | 10/1976 | Petermann et al. | 134/34 |
| 4,191,591 | 3/1980 | Bender et al. | 134/30 X |
| 4,595,419 | 6/1986 | Patenaude | 134/1 |
| 4,597,989 | 7/1986 | Wonsowicz et al. | 427/99 |
| 4,859,249 | 9/1989 | Valentini | 134/22.18 |
| 5,030,536 | 7/1991 | Pai et al. | 430/127 |
| 5,109,562 | 5/1992 | Albrecht | 15/56 |
| 5,286,301 | 2/1994 | Albrecht | 134/8 |
| 5,352,298 | 10/1994 | Moulder | 134/22.18 |

*Primary Examiner*—David L. Lacey
*Assistant Examiner*—Sean Vincent
*Attorney, Agent, or Firm*—Sughrue, Mion, Zinn, Macpeak & Seas

[57] ABSTRACT

When vapor-depositing a magnetic material 6 onto a base 3 in a vacuum vapor deposition tank 1, to clean the residue of evaporated atoms evaporated from the magnetic material 6 adhering undesirably to members 9, 10 constituting the vacuum vapor deposition tank 1, the members 9, 10 are separated and transported to a cleaning position after the completion of the process of vapor deposition onto the base 3, and the members 9, 10 are cleaned by a cleaning robot 21 arranged to be capable of controlling the cleaning direction, water pressure, and the like at the cleaning position. The members 9, 10 are then allowed to wait at the standby position in preparation for an ensuing vapor deposition process, and cleaning water is accommodated in a tank to ensure reutilization.

10 Claims, 3 Drawing Sheets

METHOD OF AUTOMATICALLY CLEANING A VACUUM VAPOR DEPOSITION TANK

BACKGROUND OF THE INVENTION

The present invention relates to a cleaning method suitable for removing contamination from a vacuum vapor deposition tank and the like which constitute a vacuum vapor deposition apparatus used in the manufacture of, for instance, a magnetic recording medium, and to a cleaning apparatus for implementing the cleaning method.

As is generally known, magnetic disks and magnetic tapes are used extensively as magnetic recording media for recording video signals and audio signals. The magnetic recording media are formed by applying or vapor-depositing a magnetic material onto the surface of a substrate in which a polyester such as polyethylene terephthalate or a polyolefin such as polypropylene is formed on a film.

With respect to the magnetic recording media, there has been an increasing demand for the higher-density recording of signals. To cope with this demand, improvements on the magnetic layer are required, including the higher density of the magnetic material in the magnetic layer, an increase in coercive force, the shift of the frequency characteristic toward the short-wavelength side, and the production of a thinner film for the magnetic layer.

However, in the case where the magnetic layer is formed on the substrate surface by being applied thereto, a binder in principle remains in the magnetic layer, so that it is extremely difficult to satisfy various conditions required for the aforementioned higher-density recording.

To overcome such problems, methods of manufacturing magnetic recording media through vapor deposition processes, including vacuum vapor deposition, sputtering, ion plating, and the like have been proposed.

The manufacture of magnetic recording media through vacuum vapor deposition is effected by using a vacuum vapor deposition apparatus arranged as shown in FIG. 5. It should be noted that FIG. 5 is a schematic perspective view illustrating only a portion of the vacuum vapor deposition apparatus. A vacuum vapor deposition apparatus 1 is comprised of a cylindrical main cooling drum 2 which is rotatably disposed in an unillustrated vacuum tank; pass rollers 4, 5 for transporting a film-like base 3 in a state in which the base 3 is wound around the peripheral surface of the main cooling drum 2; a crucible 7 accommodating a magnetic material 6 and disposed on the lower side of the main cooling drum 2; an electron gun 8 for heating and evaporating the magnetic material 6 by irradiating the magnetic material 6 with an electron beam; a condensate hood 9 for preventing the evaporated magnetic material from adhering to objects other than the film; a mask 10 for restricting an evaporation area of the magnetic material 6, and so on.

In addition, the interior of the vacuum tank is held at, for example, $1.0 \times 10^{-4}$ [Torr] by means of a vacuum exhaust pump. In addition, the arrangement provided is such that the base 3 is passed from an unillustrated feed roller to the pass roller 4, is wound around the peripheral surface of the cooling roller 2, and is taken up onto an unillustrated takeup roller via the pass roller 5.

An opening 10a and a shutter mechanism are provided in the mask 10 at a position facing the peripheral surface of the main cooling drum 2, so as to allow both ends of the base 3 to be shielded and the evaporation area to be restricted, as required, when the magnetic material 6 is vapor-deposited.

Next, a description will be given of a method of manufacturing a magnetic recording medium by using the above-described apparatus 1. The feed roller is driven to convey the base 3, and the main cooling drum 2 is rotated in the direction of arrow A in a state in which the main cooling drum 2 is cooled to, for example, −30° C. or thereabouts.

At the same time, the magnetic material 6 is evaporated by being heated by an electron beam from the electron gun 8, and evaporated particles (magnetic material) are allowed to be continuously vapor-deposited onto the surface of the base 3 exposed at the opening 10a. In this manner, the magnetic material 6 is vapor-deposited onto the surface of the base 3, and the vapor-deposited base 3 is taken up onto the takeup roller via the pass roller 5.

As compared with the magnetic recording medium manufactured by coating with the magnetic material, the magnetic recording medium thus manufactured provides a remarkably large reproduction output, and the frequency characteristic in magnetic recording extends to the shorter-wavelength side. Hence, the magnetic recording medium of this type is useful as a high-density magnetic recording medium.

The vacuum vapor deposition on the base 3 is effected continuously with respect to a base having a length of several thousand meters. If continuous vapor deposition is effected with respect to such an elongated base, the residue of the evaporated particles adheres in a large volume to the shutter mechanism including the mask 10 and to internal walls of the condensate hood 9. If the amount of the adhering residue becomes large, there arise such problems as the peeling off the residue from the inner walls, the impairment of the restriction of the aforementioned evaporation area, and the adsorption of gas components in the atmospheric air. For this reason, it has been necessary to remove the residue for each vapor deposition process or replace the members with new ones.

Conventionally, the removal of the residue is carried out manually by using a jig. However, since the residue adheres firmly to the members, it is necessary to break it off or scrape it off, so that the cleaning operation has been troublesome and required much labor. Although careful cleaning of the residue ensures stabilization of the quality of the magnetic recording medium, the need for expending much time in the cleaning operation disadvantageously prolongs the cycle of the vapor deposition process, resulting in a substantial decline in productivity.

Furthermore, most of the removed residue has hitherto been discarded. Since the members to which the residue adheres are conventionally damaged or scraped by means of the scraping jig when the residue is scraped off, as described above, the removed residue includes impurities such as scraped pieces of the members, which causes a hindrance at the time of collection and separation of the residue for reutilization, and has constituted a major factor of a decline in the utilization efficiency of the magnetic material.

SUMMARY OF THE INVENTION

An object of the present invention is to provide a method and an apparatus for cleaning a vacuum vapor deposition tank which are capable of efficiently effecting the cleaning of the vacuum vapor deposition tank for vacuum-depositing a magnetic material serving as a magnetic recording medium, and of improving the product yield and reutilization of the magnetic material.

The above object of the present invention can be attained by a method of automatically cleaning a vacuum vapor deposition tank, characterized in that a member to be cleaned to which an evaporated substance adheres in a vacuum vapor deposition tank for vacuum-depositing a magnetic material is cleaned with a cleaning fluid which is injected under high pressure. Furthermore, the object can be similarly attained by a method of automatically cleaning a vacuum vapor deposition tank, characterized in that a member to be cleaned to which an evaporated substance adheres in a vacuum vapor deposition tank for vacuum-depositing a magnetic material is transported outside the vacuum vapor deposition tank to a cleaning area via a fixed carrying-in-and-out passage, after the member to be cleaned is cleaned with a cleaning fluid which is injected under high pressure in the cleaning area. The member to be cleaned is transferred to a drying area and is dried, and the member to be cleaned is subsequently returned to the carrying- in-and-out passage and is fitted in the vacuum vapor deposition tank. In addition, the above object can be attained by a method of cleaning a vacuum vapor deposition tank, wherein a plurality of units are used as the member to be cleaned. When one of the units is transported out of the vacuum vapor deposition tank, another unit is fitted in the vacuum vapor deposition tank, and a vapor deposition process in the vacuum vapor deposition tank and a cleaning process are conducted simultaneously. Also, the invention includes a method of cleaning a vacuum vapor deposition tank, wherein the evaporated substance removed by the cleaning fluid in the cleaning area is separated from the cleaning fluid and is collected.

In addition, the above object of the present invention is attained by an apparatus for automatically cleaning a vacuum vapor deposition tank, comprising carrying-in-and-out means for carrying in and out a member to be cleaned in a vacuum vapor deposition tank for vacuum-depositing a magnetic material to inside and outside the vacuum vapor deposition tank; a cleaning section for cleaning the carried-out cleaning member to be cleaned with a cleaning fluid which is injected under high pressure; and a drying section for drying the member to be cleaned which has been cleaned by the cleaning section, wherein the carrying-in-and-out means is arranged to be capable of moving consecutively from the cleaning section to the vacuum vapor deposition tank via the drying section, and operations including the removal of the member to be cleaned, cleaning, drying, and fitting thereof are effected along a fixed moving passage.

Also, the above object can be attained by an apparatus for automatically cleaning a vacuum vapor deposition tank, characterized in that an openable opening/closing portion is provided in a wall surface of a vacuum vapor deposition tank for vacuum-depositing a magnetic material, cleaning means for injecting a cleaning fluid which is injected under high pressure is arranged to be movable along a moving passage and capable of entering the vacuum tank through the opening/closing portion, and a member to be cleaned as fitted in the vacuum vapor deposition tank is cleaned by the cleaning means.

DESCRIPTION OF THE PREFERRED EMBODIMENTS

Figure 1:
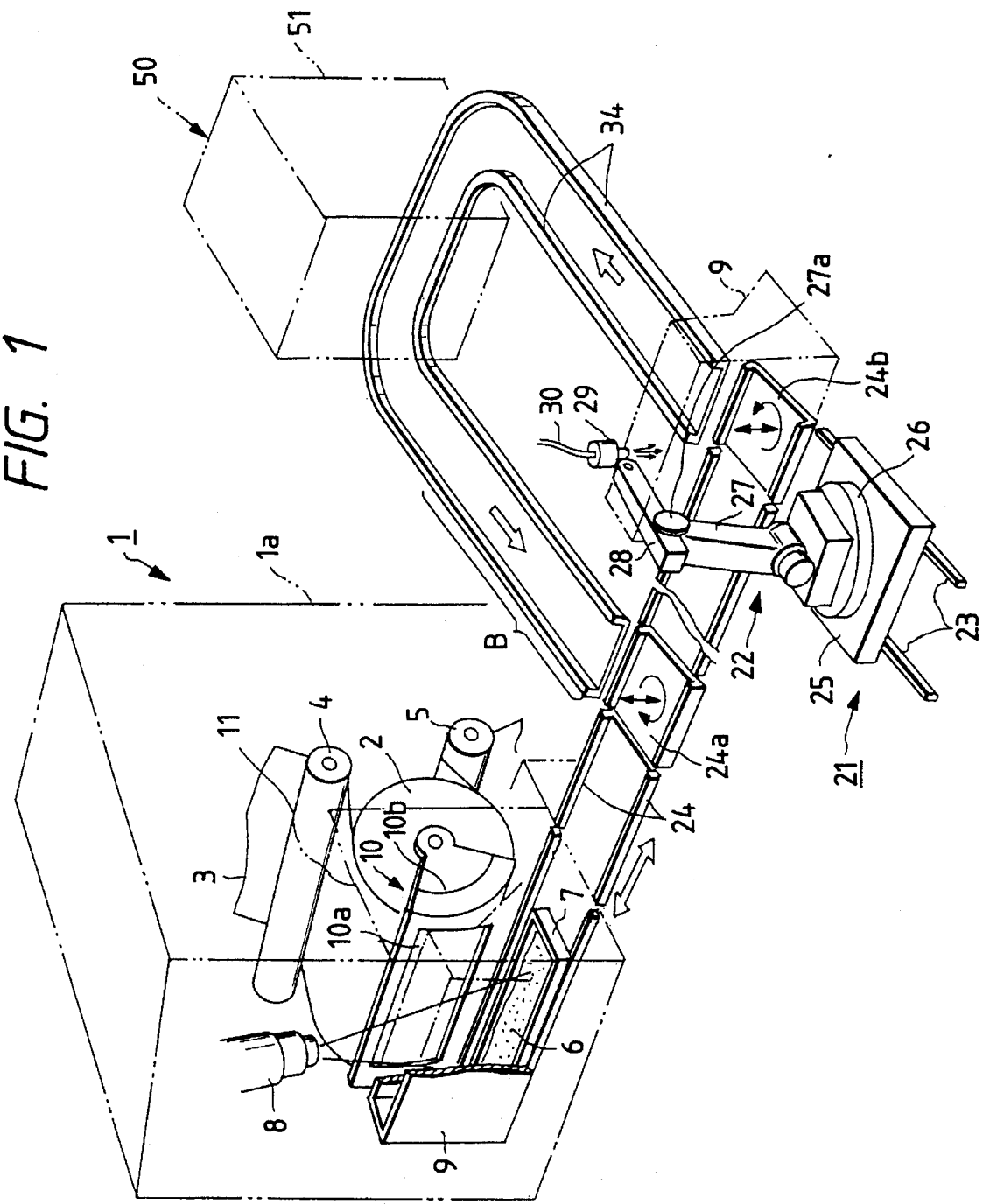
FIG. 1 is a perspective view of essential portions of a vacuum vapor deposition apparatus illustrating an embodiment of the present invention.
Figure 2:
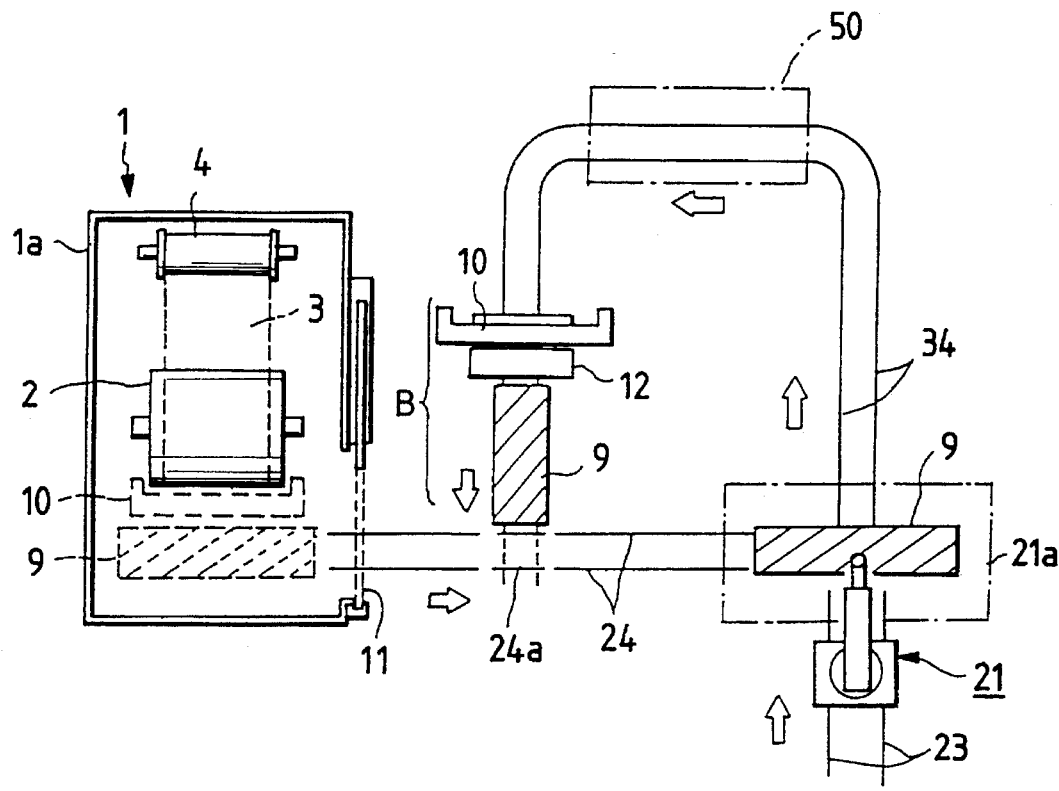
FIG. 2 is a schematic diagram of the vacuum vapor deposition apparatus and a cleaning apparatus.

Referring now to FIGS. 1 and 2, a description will be given of an embodiment of the present invention. FIG. 1 is a perspective view of essential portions which illustrates a vacuum vapor deposition tank, i.e., an apparatus for manufacturing a magnetic recording medium, and an automatic cleaning apparatus. FIG. 2 is a schematic diagram illustrating automatic-cleaning and drying processes. It should be noted that, as for various members in the vacuum vapor deposition tank, those members that perform the same operation as those of the conventional example will be denoted by the same reference numerals, and description thereof will be omitted.

The automatic cleaning apparatus in this embodiment is an apparatus which is disposed adjacent to a vacuum vapor deposition apparatus 1 provided with various members in a vacuum vapor deposition tank 1a for vacuum-depositing a magnetic material. In terms of its configuration, the automatic cleaning apparatus is comprised of rails 24 which serve as a carrying-in-and-out means for carrying out a condensate hood 9, a mask 10 and the like, which are referred to in the present invention as members to be cleaned, to a position outside the vacuum vapor deposition tank 1a through a gate 11, i.e., an opening/closing portion, and for carrying them back in; a cleaning device 21 which is a cleaning section for cleaning the carried-out condensate hood 9 and the like with a cleaning liquid; and rails 34 in the form of a loop for transporting the condensate hood 9 and the like, cleaned by the cleaning device 21, to a drying section 50 and then onto the rails 24. By virtue of this structure, a series of operation from the time the condensate hood 9 and the like are removed from the vacuum vapor deposition tank 1a until they are fitted again after being cleaned and dried, can be effected speedily and efficiently along a fixed moving passage, as will be described later.

The cleaning device 21 is comprised of an automatic cleaning robot 22 (hereafter simply referred to as the robot), rails 23 for transporting the robot 22, a partition case 21a (see FIG. 2) for preventing the scattering of the cleaning liquid (water is used in this embodiment) and the residue, and so on. The rails 24 extend appropriately so as to transport the condensate hood 9 to a predetermined position of the cleaning device 21.

The robot 22 is comprised of a carriage 25 for moving on the rails 23, a base 26 provided rotatably on the carriage 25, a rotating arm 27 which is rotatably provided on the base 26, a lifting arm 28 which is rotatable by means of a flexing portion 27a, an injection nozzle 29 rotatably provided on a distal end of the lifting arm 28, and a pipe 30 for supplying water to the injection nozzle 29.

In addition, in this embodiment, wheels 13 (see FIG. 3) corresponding to the rails 24 and 23 are provided appropriately on the lower surface of the condensate hood 9. The rails 24 extend into the vacuum vapor deposition tank 1a, so that the condensate hood 9 can be removed from the vacuum vapor deposition tank and reset therein as the condensate hood 9 moves on the rails 24. It should be noted that the portions of the rails 24 which are in the way of the movement of the gate 11 are cut off so that the gate 11 (see FIG. 2) of the vacuum vapor deposition tank 1a can be opened and closed.

Figure 3:
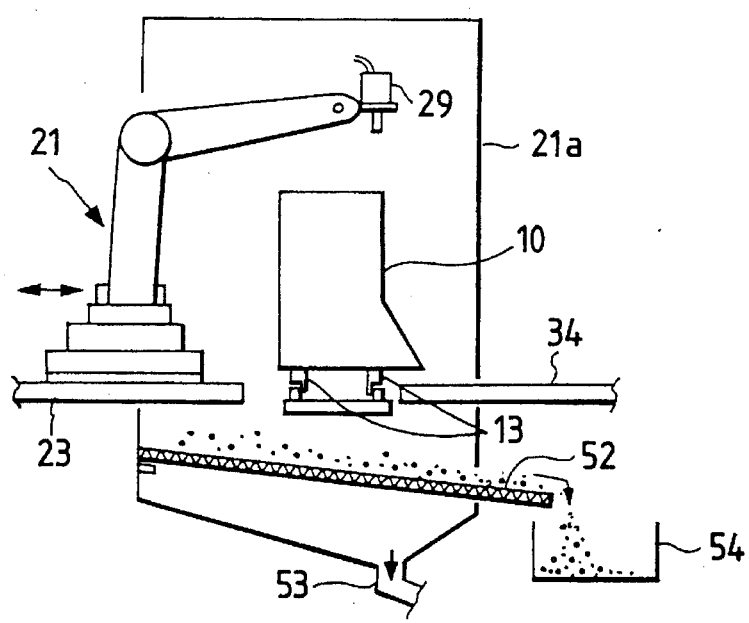
FIG. 3 is a perspective view illustrating a structure of a device for collecting the residue in the apparatus shown in FIG. 1.

Next, referring to FIGS. 1, 2, and 3, a description will be given of a method of cleaning the above-described apparatus after the vapor deposition of a magnetic material 6 onto the base 3.

The vapor deposition of the magnetic material 6 onto the base 3 is effected in the same way as in the conventional example explained with reference to FIG. 4. After vapor deposition, the operation proceeds to the cleaning of the condensate hood 9 and the mask 10. It should be noted that the condensate hood 9 is detachable from the vacuum tank as it is moved on the rails 24, as described above. Opposite end pieces 10b of the mask 10 are attached to a portion of the rotational center of the drum, and the mask 10 can be removed from the vacuum tank by making these opposite end pieces 10b splittable, as required. The mask 10, after being removed, is placed on, for example, a wagon which is capable of running on the rails. Although the mask 10 and the condensate hood 9 are cleaned simultaneously, FIG. 1 shows only the condensate hood 9 for the convenience of illustration.

After completion of a long period of vapor deposition of the magnetic material 6 onto the base 3, a large quantity of evaporated atoms adheres to the condensate hood 9 and the mask 10. To clean these adhered evaporated atoms, the gate 11 is first opened, and the condensate hood 9 and the mask 10 are moved along the rails 24. It should be noted that it is possible to adopt either the arrangement in which wheels are provided (there are cases where the relevant members can be self-propelled or moved by another means) as in the case of the condensate hood 9, or an arrangement in which the members are transported by being placed on a self-propelled carriage. The condensate hood 9 and the mask 10 are further moved on the rails 24 to a cleaning position, e.g., a position of intersection with the rails 23.

After this carrying-out is done, another condensate hood 9 and another mask 10, for which the cleaning of their interiors has been completed and which have waited on the rails 34 at a standby position B, are carried into and fitted in the vacuum tank so that a blank will not occur in an ensuing vapor deposition process. At this time, the transfer from the rails 34 to the rails 24 becomes possible as a transfer section 24a is moved vertically and swiveled to cause the rails in the transfer section 24a to be aligned with both rails 24 and 34.

On the vacuum vapor deposition apparatus 1 side, after conducting preparations including the winding of the base 3 for vapor deposition and the replenishment of the magnetic material 6, the gate 11 is closed, and the interior of the vacuum tank is evacuated before proceeding to an ensuing vacuum deposition process.

Meanwhile, the carried-out condensate hood 9 and the like are cleaned by the robot 21 which has been waiting at the cleaning position. Cleaning is carried out by injecting under high pressure the cleaning water supplied from the hose 30 to the nozzle 29. Since the robot 21 is arranged as a so-called articulated robot by means of the rotating arm 27 and the lifting arm 28, the direction of the nozzle 29, i.e., the direction of high-pressure injection of the cleaning water, can be freely altered. Hence, the entire inner wall surfaces, including every corner, of the condensate hood 9 and the like can be cleaned.

During this cleaning, the aforementioned residue can be removed completely without scraping the wall surfaces of the condensate hood 9 by making use of the pressure of the high-pressure injection of the cleaning water.

In addition, the injecting direction and the like of the robot 21 are programmed in conformity with the shape and the like of the objects to be cleaned, and automatic cleaning is effected in accordance with that program.

In this cleaning, the impact of injection of the cleaning water injected from the nozzle 29 depends on the pressure and the flow rate of that cleaning water. As a result of conducting a test on removal of the residue, it was found that the effect of removing the residue was satisfactory when the pressure of the cleaning water was in the range of 100 to 5000 $kgf/cm^2$ by using a high-pressure plunger pump at a discharge rate of 5 liters/min. to 400 liters/min.

Figure 6:
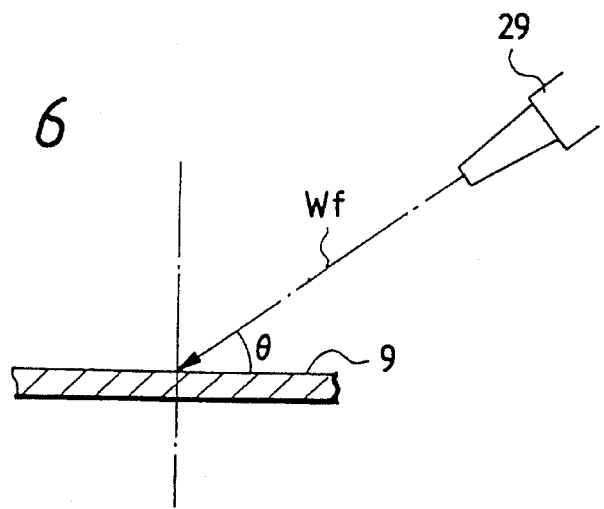
FIG. 6 is a schematic view showing an incident angle of the cleaning water with respect to the object to be cleaned.

As shown in FIG. 6, the cleaning effect can be enhanced if an incident angle q of the cleaning water Wf with respect to the object 9 to be cleaned is adjusted in the range of 45° to 90° between the direction of the nozzle 29 and the cleaning surface of the object 9 to be cleaned, preferably in the range of 75° to 90° for better results.

The residue (magnetic material) removed by the high-pressure injection of the cleaning water, together with the cleaning water, flows downwardly in the partition case 21a. Midway in this flow, the residue is filtered by a separating member 52 in the form of a filter or a mesh, and is collected in a collecting section 54. Meanwhile, the cleaning water is drained from a drain port 53 provided at a lower portion of the partition case 21a. As for the residue thus filtered, its purity is substantially the same as that of the original material since nothing other than the cleaning water is mixed in it. Thus, the material can be reproduced very easily so as to be reutilized.

The condensate hood 9 and the like after cleaning are moved onto the rails 34. This transfer operation can be effected by a transfer section 24b which is capable of moving vertically and swiveling in the same way as the aforementioned transfer section 24a.

The condensate hood 9 and the like which are moved onto the rails 34 are moved to the drying section 50 so as to be dried, and are moved further to the standby position B where they remain on standby for an ensuing exchange. Although the structure of the drying section 50 is not particularly limited, it is possible to adopt, as required, a structure in which, for instance, a hood 41 capable of enclosing the condensate hood 9 and the like, i.e., the objects to be dried, is provided, and the condensate hood 9 and the like are dried by blowing drying warm air into the hood 51.

Thus, the vapor deposition of the magnetic material 6 onto the base 3 and the cleaning off of the residue of evaporated atoms adhering to the condensate hood 9, the mask 10 and the like are carried out simultaneously, and the cleaned condensate hood 9 and mask 10 are set on standby for ensuing vapor deposition. Accordingly, the process of vapor evaporation of the magnetic material 6 onto the base 3 is not affected by the operation time of the cleaning process, so that the operation is carried out very efficiently.

Although, in the above-described embodiment, the members to be cleaned are removed from the vacuum tank so as to be cleaned, the present invention is not limited to the same. The gate 11 which can be opened and closed is provided on a wall surface of the vacuum vapor deposition tank 1a, and the cleaning robot 22, i.e., a cleaning means for injecting a cleaning liquid under high pressure, is movable along a moving passage consisting of the rails 23, the transfer section 24b, and the rails 24 (the rails 24 and the rails 23 being constructed with the same widths), and is arranged to be capable of entering the vacuum tank through the gate 11. Hence, the members to be cleaned such as the condensate hood 9 and the mask 10 as fitted inside the vacuum vapor deposition tank 1a can be cleaned by the cleaning robot 22.

The present invention is not limited to the above-described embodiment, and various modifications are possible. For instance, if the transporting system for the members to be cleaned is arranged such that the members to be cleaned are moved on a specific passage by means of a self-propelled carriage instead of the rail structure, the structures of the transfer sections 24a and 24b in the above-described embodiment are not required. In addition, it is possible to adopt an arrangement in which the members to be cleaned are suspended from above. Further, by constructing the condensate hood and the mask into an integral structure, the setting and removal of the members to be cleaned can be effected very speedily.

The cleaning method in accordance with the present invention is applicable not only for the cleaning of the above-described vacuum vapor deposition apparatus 1, but can be applied to other vacuum film-forming apparatuses, such as sputtering apparatuses, ion-plating apparatuses, CVD apparatuses, and etching apparatuses.

As described above, in the method and apparatus for cleaning a vacuum vapor deposition tank in accordance with the present invention, when the magnetic material is vapor-deposited on the base in the vacuum vapor deposition tank, in order to clean off the residue of evaporated atoms evaporated from the magnetic material and adhering undesirably to members constituting the vacuum vapor deposition tank, the members are separated from the vacuum vapor deposition tank and transported to a cleaning position after the completion of the process of vapor deposition onto the base. Then, after cleaning is effected at the cleaning position by a cleaning means arranged to be capable of freely controlling the cleaning direction, pressure and the like, the members are allowed to wait at a standby position. Accordingly, since the residue adhering to the members constituting the vacuum vapor deposition tank is washed off by high-pressure injection of the cleaning water through the manipulation of a robot, the safety is high, and the operating efficiency improves as compared with the manual cleaning. Furthermore, since the cleaning and vapor deposition processes can be effected in the form of simultaneous progress, productivity can be improved. In addition, in accordance with the present invention, since a jig for scraping off is not used, the surfaces of the members are not damaged or shaved, and since impurities are not mixed in the cleaning water after the cleaning off of the residue, it is possible to separate the residue by filtering the cleaning water including the residue, so as to reutilize the residue.

Example 1

The present invention will be described more clearly by citing the following examples.

The vacuum vapor deposition apparatus shown in FIG. 1 was used, and $Co_{80}N_{20}$ was used as the magnetic material 6 and was heated by the electron gun 8 to cause evaporation, thereby forming a thin film with a thickness of 1800/O(A,°) on the base 3 having an overall length of 3000 m.

The shutter mechanism including the mask 10 was formed of a stainless material, and was so structured to allow cooling water to pass in its interior. In addition, the condensate hood 9 and a deposition-preventing plate of unillustrated inner walls were formed of a copper material, and were so structured to allow cooling water to pass in its interior.

After vapor deposition was performed with respect to the base 3, the residue of a CoNi metal with a thickness of 2 to 4 mm adhered to the inner wall surfaces of the shutter mechanism including the mask 10, and the residue with a thickness of 5 to 10 mm adhered to the inner wall surfaces of the condensate hood 9.

It is difficult to carry out the next trial manufacture with these adhered residues. The reason is that the aforementioned metallic residue is peeled off in the form of a lump and is dropped into the crucible 7. In addition, the metallic residue adhering to the mask 10 and the like changes the shape of the evaporation-area restricting portion, with the result that the evaporated atoms fail to be vapor-deposited uniformly at a desired position on the base 3, making it impossible to obtain desired magnetic characteristics. Further, insufficient removal of the residue constitutes a factor changing the magnetic characteristics per batch due to the effect of adsorption of moisture and the like contained in the air.

Accordingly, to remove the metallic residue, the condensate hood 9, the mask 10 and the like are removed from the vacuum tank, and are cleaned by the cleaning robot 21, as described above.

In this cleaning, a test on removal of the metallic residue was conducted by using the injection impact of the cleaning water which jets out from the nozzle 29. As for the cleaning water, the test was conducted by classifying the pressure into the range of 100 to 1000 $kgf/cm^2$ and the range of 1500 to 5000 $kgf/cm^2$ by using a high-pressure plunger pump.

As for the results of cleaning, the case where 90% or more of the area of the material member was visually observed to be exposed in an area of 200 mm was evaluated as ⊙, the case where 70% or more of the same was exposed was evaluated as O, the case where 50% or more of the same was exposed was evaluated as Δ, and the case where less than 50% of the same was exposed was evaluated as X. It should be noted that set parameters include (1) discharge pressure, (2) discharge flow rate, (3) the nozzle shape, (4) the distance between the object to be cleaned and the nozzle 29; (5) the moving speed of the nozzle 29, and (6) the angle of incidence of the cleaning water upon the surface to be cleaned.

First, in order to investigate the distance between the nozzle 29 and the object to be cleaned such as the condensate hood 9, the moving speed of the nozzle 29, and the angle of incidence of the cleaning water upon the object to be cleaned, the aforementioned test was conducted at a discharge pressure of 500 $kgf/cm^2$ and a discharge flow rate of 40 litters/min. by using a fan-shaped nozzle.

Consequently, it was possible to set the distance between the object to be cleaned and the nozzle to 150 mm, the moving speed of the nozzle 29 in the range of 50 to 100 mm/sec., the incident angle q of the cleaning water Wf with respect to the object 9 to be cleaned, as shown in FIG. 6, in the range of 45° to 90° between the direction of the nozzle 29 and the cleaning surface of the object 9 to be cleaned, preferably in the range of 75° to 90°.

Next, a straight-advancing nozzle and the fan-shaped nozzle were compared with respect to the nozzle 29 under the above-described conditions. Consequently, it became clear that the capability of exfoliating the metallic residue was substantially the same between the two types of nozzle, and that the fan-shaped nozzle is advantageous by the portion in which its cleaning width is wide.

By using the above settings as basic conditions, Experiments 1, 2 and 3, which will be described later, were conducted with respect to the discharge pressure and the discharge flow rate. In conducting the experiments, the fan-shaped nozzle was used as the nozzle 29, the distance between the object to be cleaned and the nozzle 29 was set to 150 mm, the moving speed of the nozzle 29 was set to 100 mm/sec., and the incident angle of the cleaning water with respect to the object to be cleaned was set to 90° C. To give a description of Experiment 1, in a case where the discharge flow rate was set to 40 litters/min., and the discharge pressure was varied in the range of 50 to 1000 kgf/cm$^2$, the results of the experiment were obtained as shown in Table 1.

TABLE 1

| Experiment 1 | Flow rate: 40 [l/min] |
|---|---|
| Discharg Pressure [kgf/cm$^2$] | Cleaning Effect |
| 50 | X |
| 100 | Δ |
| 300 | ○ |
| 500 | ⊚ |
| 700 | ⊚ |
| 1000 | ⊚ |

Next, to give a description of Experiment 2, the discharge flow rate was set to 12 litters/min., the discharge pressure was varied in the range of 1500 to 5000 kgf/cm$^2$, and the results of the experiment were obtained as shown in Table 2.

TABLE 2

| Experiment 2 | Flow rate: 12 [l/min] |
|---|---|
| Discharge Pressure [kgf/cm$^2$] | Cleaning Effect |
| 1500 | ⊚ |
| 2000 | ⊚ |
| 3000 | ○ |
| 5000 | Δ |

As a result of conducting Experiments 1 and 2, the cleaning effect was noted under the discharge pressure of 100 to 5000 kgf/cm$^2$, and it became clear that the range of 500 to 1000 kgf/cm$^2$ is preferable. In addition, it also became clear that if the discharge pressure is outside a range exceeding 1500 kgf/cm$^2$, the exfoliation effect is high, but the exfoliated portions were linear, so that it takes time to clean the entire area, thereby presenting a problem in practical use.

Also, it became clear that if the pressure reaches 3000 kgf/cm$^2$, the situation becomes such that the members themselves are shaved off, so that there is the risk of the shaved portions of the members being mixed in as impurities. In this case, the shaved portions of the members thus mixed in are liable to cause a hindrance to the reutilization of the metallic residue.

Next, to give a description of Experiment 3, the discharge pressure was set to 500 kgf/cm$^2$, the discharge flow rate was varied in the range of 5 to 400 liters/min., and the other conditions were set in the same way as in the above Experiments 1 and 2. Table 3 shows the results of Experiment 3.

TABLE 3

| Experiment 3 | Discharge pressure: 500 [kgf/cm$^2$] |
|---|---|
| Discharge flow rate [l/min] | Cleaning Effect |
| 5 | X |
| 10 | Δ |
| 20 | ○ |
| 40 | ⊚ |
| 100 | ⊚ |
| 200 | ⊚ |
| 400 | ⊚ |

According to the results of the experiment, a noticeable cleaning effect was noted in the case where the discharge flow rate was 10 liters/min. or more. Further, it became clear that the range of 40 to 100 liters/min. is preferable. It should be noted that even if the discharge flow rate was set to 100 liters/min. or more, no clear-cut difference was noted in the cleaning effect. Therefore, if economic factors such as the waste-water treatment capacity are taken into consideration, the range of 40 to 100 liters/min. is appropriate.

In addition, although differences were noted in the exfoliation effect depending on the portions of the object to be cleaned where the metallic residue adhered, it became clear that it is possible to sufficiently cope with the problem by adjusting the cleaning time by changing the moving speed of the nozzle 29 in practical application.

On the basis of the results of Experiments 1 to 3 described above, the discharge output was set to 500 kgf/cm$^2$, the discharge flow rate was set to 40 litters/min., the fan-shaped nozzle was used as the nozzle 29, the distance between the object to be cleaned and the nozzle 29 to 150 mm, the moving speed of the nozzle 29 was set to 100 mm/sec., the incident angle of the cleaning water with respect to the object to be cleaned was set to 90°, and the metallic residue adhering to the objects to be cleaned, such as the condensate hood 9 and the mask 10, was washed off by making use of an impact derived from the high-pressure injection of cleaning water.

As a result, the objects to be cleaned, after cleaning, were cleaned far more effectively than the manual cleaning based on the crushing-down or scraping-down operation practiced in the prior art, and the cleaning time was diminished to one-third. The metallic residue removed by cleaning, together with the cleaning water, was temporarily accommodated in the tank, and was subsequently reutilized by being separated by a filter, thereby making it possible to improve the efficiency of material utilization. The objects to be cleaned, after cleaning, were dried with warm air, and were refitted in the above-described manufacturing apparatus 1 so as to trial-manufacture the magnetic recording medium.

The above-described process was repeated, and as a result of evaluating the reproducibility of the magnetic characteristics for each trial manufacture, the reproducibility improved remarkably as compared with the repeated process of the manual cleaning operation practiced in the prior art, thereby making it possible substantially improve productivity.

EXAMPLE 2

Figure 4:
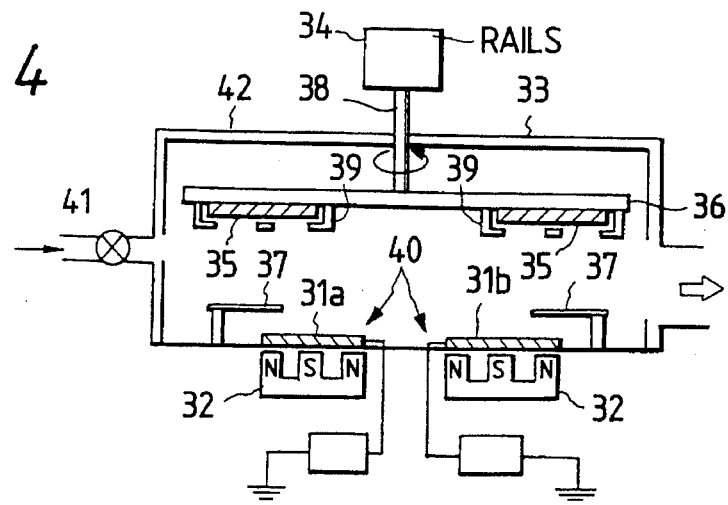
FIG. 4 is a schematic diagram of a sputtering film-forming apparatus.
Figure 5:
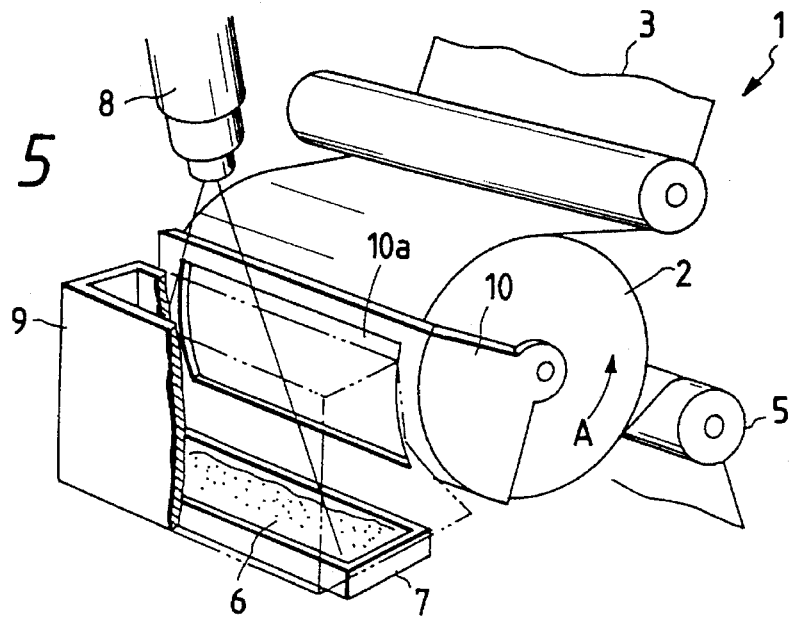
FIG. 5 is a perspective view of essential portions of a conventional vacuum vapor deposition apparatus.

The following is an example in which the apparatus shown in FIG. 4 was used. It should be noted that FIG. 4 is a schematic diagram of a sputtering film-forming apparatus, and this example shows an application to the sputtering film-forming apparatus.

First, a description will be given of various components. Reference numerals 31a and 31b denote a magnetic material, and in this example $Si_3N_4$ is used. Numeral 33 denotes a vacuum chamber; 34, a pallet-rotating device; 35, a substrate; 36, a pallet; 37, a plate for correcting the distribution of film thickness; 38, a pallet-rotating shaft; 39, a mask; 40, a sputtering cathode; 41, a sputter-gas introducing nozzle; and 42, a deposition-preventing plate.

It should be noted that the members to be cleaned in this apparatus are the plate 37 for correcting the distribution of film thickness, the pallet 36, the mask 39, and the deposition-preventing plate 42. The material of the members to be cleaned is SUS 404.

In this example, the magnetic material is set as described above, and sputtering is effected in the atmosphere of an argon gas introduced from the sputter-gas introducing nozzle 41, so as to form an $Si_3N_4$ film on the substrate 35.

The plate 37 for correcting the distribution of film thickness to make uniform the thickness of the film formed on the plastic substrate 35 having a thickness of 5 mm, as well as the mask 39 for shielding a peripheral rim and a central portion of the plastic substrate 35 from film formation, are formed within the chamber 33. Furthermore, the deposition-preventing plate 42 is attached to the front surface of an inner wall surface of the vacuum chamber 33 in such a manner as to substantially cover the inner wall surface.

During film formation by sputtering, the $Si_3N_4$ film is formed on the surfaces of the aforementioned members other than the plastic substrate 35, the thickness gradually increases each time the trial manufacture is repeated, and the film is ultimately exfoliated and drop off from the surfaces. The exfoliated substance constitutes a factor producing defects such as pin holes in the film-forming process of the magnetic recording medium, and it is desirous to remove this undesirable film in light of improvement of the quality and yield.

However, there has been no basic solution, and the conventional practice has been such that, after the film-forming process is repeated a number of times, the operations of removing and replacing the aforementioned members and of removing the adhering substance by means of blast processing or the like are conducted manually. For this reason, the costs of the members increased, and a large amount of operating time was required.

The method of the present invention was applied to experiments 4 and 5, which will be described hereafter, and it was possible to overcome the above-described problems.

In Experiments 4 and 5, a straight-advancing type nozzle was used as the nozzle 29, the distance between the object to be cleaned and the nozzle 29 was set to 100 mm, the moving speed of the nozzle 29 was set to 50 mm/sec., and the incident angle of the cleaning water with respect to the object to be cleaned was set to 90°, In addition, with respect to Experiment 4, the discharge flow rate was set to 20 litters/min., and the discharge pressure was varied in the range of 50 to 1000 kgf/cm². With respect to Experiment 5, the discharge flow rate was set to 12 litters/min., and the discharge pressure was varied in the range of 1500 to 5000 kgf/cm².

Tables 4 and 5 below show the results of Experiments 4 and 5, respectively.

| Experiment 4 | Flow rate: 20 [l/min] |
|---|---|
| Discharge Pressure [kgf/cm²] | Cleaning Effect |
| 50 | X |
| 100 | X |
| 300 | X |
| 500 | X |
| 700 | Δ |
| 1000 | Δ |

TABLE 5

| Experiment 5 | Flow rate: 12 [l/min] |
|---|---|
| Discharge Pressure [kgf/cm²] | Cleaning Effect |
| 1500 | ○ |
| 2000 | ⊚ |
| 3000 | ⊚ |
| 5000 | ⊚ |

According to the results of the experiments, a noticeable cleaning effect was noted under the condition in which the discharge pressure was set in the range of 700 to 5000 kgf/cm², and it became clear that the range of 1500 to 5000 kgf/cm² is more preferable.

Next, Experiment 6 was conducted by setting the discharge pressure to 2000 kgf/cm², and by varying the discharge flow rate in the range of 5 to 20 litters/min. Incidentally, the other conditions of the experiment were set in the same way as in Experiments 4 and 5. The results of Experiment 6 are shown in Table 6 below.

TABLE 6

| Experiment 6 | Discharge pressure: 2000 [kgf/cm²] |
|---|---|
| Discharge flow rate [l/min] | Cleaning Effect |
| 5 | ○ |
| 8 | ⊚ |
| 12 | ⊚ |
| 15 | ⊚ |
| 20 | ⊚ |

According to the results of the experiment, a noticeable cleaning effect was noted in the entire range of 5 to 20 liters/min. set as the discharge flow rate, and it became clear that the range of 8 to 20 liters/min. is more preferable. Furthermore, it became clear that, with respect to the exfoliation of the Si3N4 film, the setting of the discharge pressure is important. On the basis of the results of Experiments 4 to 6, the discharge pressure was set to 2000 kgf/cm², the discharge flow rate was set to 12 liters/min., the straight-advancing type nozzle was used as the nozzle 29, the distance between the object to be cleaned and the nozzle 29 to 100 mm, the moving speed of the nozzle 29 was set to 50 mm/sec., the incident angle of the cleaning water with respect to the object to be cleaned was set to 90°, and the $Si_3N_4$ film adhering to the mask 39, the plate 37 for correcting the distribution of film thickness, and the deposition-preventing plate 42 was washed off by making use of an impact derived from high-pressure water injection.

As a result, an outstanding removing effect was demonstrated in comparison with the cleaning based on the conventional blast processing, and it was possible to reduce the cleaning time to one-fourth.

In addition, the cleaned members to be cleaned were dried with warm air by using the apparatus having a set line for cleaning and drying, as shown in FIG. 2. These members were fitted in the above-described sputtering film-forming apparatus for an ensuing film-forming process by sputtering, so as to trial-manufacture the $Si_3N_4$ film.

The above-described film-forming process and the cleaning process were repeated, and the occurrence of defects such as pin holes was evaluated for each trial manufacture. As a result, productivity improved by 40% or thereabouts as compared with the conventional blast processing, the cases of the occurrence of pin holes were few, the magnetic film was formed very satisfactorily, and it was possible to substantially improve the product yield.

What is claimed is:

1. A method of automatically cleaning a vacuum member wherein the member to be cleaned has a magnetic material substance adhered thereto, said member to be cleaned being used in a vacuum vapor deposition tank for vacuum-depositing a magnetic material, said method comprising:

transporting said member to be cleaned outside said vacuum vapor deposition tank to a cleaning area via a passage;

cleaning the member to be cleaned with a cleaning fluid which is injected under high pressure in the range of 100 to 5000 $kgf/cm^2$, inclusive in the cleaning area;

transferring the member to be cleaned to a drying area and drying the member to be cleaned;

subsequently returning the member to be cleaned to the vacuum vapor deposition tank through the passage.

2. A method according to claim 1, wherein, the member to be cleaned is one of a plurality of units, further comprising when one of said units is transported out of said vacuum vapor deposition tank, another unit is fitted in said vacuum vapor deposition tank, and a vapor deposition process is conducted with said another unit in said vacuum vapor deposition tank and said cleaning process is conducted simultaneously on said one of said units.

3. A method according to claim 1, wherein the substance removed by the cleaning fluid in said cleaning area is separated from the cleaning fluid and collected.

4. A method as recited in claim 1 wherein said transporting, transferring, and returning steps are accomplished by carrying means which extend from an interior of the vacuum vapor deposition tank, through the passage, to the cleaning area and the drying area.

5. A method as recited in claim 4, wherein said carrying means comprises at least one rail and a carriage which is moveable along said at least one rail, said member to be cleaned being disposed on said carriage.

6. A method as recited in claim 5, wherein said carrying means further comprises a transfer device for changing the orientation of said carriage on said at least one rail.

7. The method as claimed in claim 1, wherein said cleaning fluid is water.

8. The method as claimed in claim 1, wherein said cleaning fluid is injected under high pressure in the range of 500 to 1000 $kgf/cm^2$ inclusive.

9. The method as claimed in claim 1, wherein a discharge flow rate of said cleaning fluid is within a range of 40 to 1000 liters/min inclusive.

10. The method as claimed in claim 1, wherein said cleaning fluid is injected under high pressure in the range of 1500 to 5000 $kgf/cm^2$ inclusive and a discharge flow rate of said cleaning fluid is within a range of 8 to 20 liters/min inclusive.

* * * * *